(12) United States Patent
Boesser et al.

(10) Patent No.: US 7,528,960 B2
(45) Date of Patent: May 5, 2009

(54) METHOD FOR ENHANCING THE MEASURING ACCURACY WHEN DETERMINING THE COORDINATES OF STRUCTURES ON A SUBSTRATE

(75) Inventors: Artur Boesser, Breidenbach (DE);
Andreas Schaaf, Mittenaar-Bicken (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 53 days.

(21) Appl. No.: 11/803,553

(22) Filed: May 15, 2007

(65) Prior Publication Data
US 2007/0268496 A1 Nov. 22, 2007

(30) Foreign Application Priority Data
May 16, 2006 (DE) .................. 10 2006 023 151
Apr. 12, 2007 (DE) .................. 10 2007 017 630

(51) Int. Cl.
*G01B 11/02* (2006.01)
(52) U.S. Cl. ..................................... 356/500
(58) Field of Classification Search ............... 356/498, 356/500; 438/14, 16
See application file for complete search history.

(56) References Cited

U.S. PATENT DOCUMENTS

| | | | |
|---|---|---|---|
| 5,469,260 A | 11/1995 | Takagi et al. | 356/358 |
| 6,268,093 B1 | 7/2001 | Kenan et al. | 430/30 |
| 6,549,648 B1 | 4/2003 | Rinn | 382/151 |
| 6,920,249 B2 | 7/2005 | Rinn et al. | 382/199 |
| 7,098,055 B2 * | 8/2006 | Noguchi et al. | 438/18 |
| 7,229,566 B2 * | 6/2007 | Matsumoto et al. | 216/60 |
| 2002/0057839 A1 * | 5/2002 | Rinn et al. | 382/199 |
| 2005/0104017 A1 | 5/2005 | Kimba et al. | 250/559.07 |
| 2007/0103696 A1 * | 5/2007 | Pohlmann | 356/498 |

FOREIGN PATENT DOCUMENTS

DE   198 25 829       12/1999
DE   100 47 211 A1    5/2002

OTHER PUBLICATIONS

Dr. Carola Bläsing: "Pattern Placement Metrology for Mask Making," at the Semicon Education Program Convention in Geneva, Mar. 31, 1998, (11 pgs).

* cited by examiner

*Primary Examiner*—Michael A Lyons
(74) *Attorney, Agent, or Firm*—Davidson, Davidson & Kappel, LLC

(57) ABSTRACT

A method for the high-precision measurement of coordinates of at least one structure on a substrate. A stage traversable in X/Y coordinate directions is provided, which is placed in an interferometric-optical measuring system. The structure on the substrate is imaged on at least one detector (34) via a measuring objective (21) having its optical axis (20) aligned in the Z coordinate direction. The structure is imaged with the so-called Dual Scan. Systematic errors can thereby be eliminated.

15 Claims, 14 Drawing Sheets

METHOD FOR ENHANCING THE MEASURING ACCURACY WHEN DETERMINING THE COORDINATES OF STRUCTURES ON A SUBSTRATE

This claims the benefit of German patent application DE 10 2006 023 151.1, filed May 16, 2006 and of German patent application DE 10 2007 017 630.0, filed Apr. 12, 2007, and hereby incorporated by reference herein.

The present invention relates to a method for the high-precision measurement of coordinates of at least one structure on a substrate placed on a stage moveable in X/Y coordinate directions in an interferometric-optical measuring system. The structure on the substrate is imaged onto a detector via a measurement objective having its optical axis aligned in the Z coordinate direction.

BACKGROUND

A measuring device as used for measuring structures on substrates (wafers or masks) has been described in detail in the paper entitled "Pattern Placement Metrology for Mask Making" held by Dr. Carola Blasing at the Semicon Education Program Convention in Geneva on Mar. 31, 1998. The description given there is the basis of a coordinate measuring device. Since the present invention can be advantageously used with such a measuring device and will be primarily described with reference to such a measuring device, without prejudice to its general applicability, this measuring device will be described in the following with reference to annexed FIG. 1. The well-known measuring device 1 is for measuring structures 31 and their coordinates on a sample 30, such as masks and wafers. In the context of the present application, the terms "sample", "substrate" and the general term "object" are to be regarded as synonymous. In the production of semiconductor chips arranged on wafers with ever increasing integration the structural widths of the individual structures 31 become ever smaller. As a consequence the requirements as to the specification of coordinate measuring devices used as measuring and inspection systems for measuring the edges and the positions of structures 31 and for measuring structural widths and overlay data become ever more stringent. Optical sampling techniques in the form similar to a microscope and in combination with a laser distance measuring system are still favored. The advantage of optical measuring devices is that they are substantially less complicated in structure and easier to operate when compared to systems with different sampling, such as X-ray or electron beam sampling, and their greater stability with respect to the position measurement.

The actual measuring system in this measuring device 1 is arranged on a vibration-damped granite block 23. The masks or wafers are placed on a measuring stage 26 by an automatic handling system. This measuring stage 26 is supported on the surface of granite block 23 by air bearings 27, 28. Measuring stage 26 is motor driven and displaceable in two dimensions (X and Y coordinate directions). The corresponding driving elements are not shown. Planar mirrors 9 are mounted on two mutually vertical sides of measuring stage 26. A laser interferometer system 29 comprising a plurality of interferometers is used to track and determine the position of measuring stage 26.

The illumination and imaging of the structures to be measured is carried out by a high-resolution microscope optics with incident light and/or transmitted light in the spectral range of the near UV (without prejudice to its general applicability). A CCD camera serves as a detector. Measuring signals are obtained from the pixels of the CCD detector array positioned within a measuring window. An intensity profile of the measured structure is derived therefrom by means of image processing, for example, for determining the edge position of the structure or the intersection point of two structures intersecting each other. Usually the positions of such structural elements are determined relative to a reference point on the substrate (mask or wafer) or relative to optical axis 20. Together with the interferometrically measured position of measuring stage 26 this results in the coordinates of structure 31. The structures on the wafers or masks used for exposure only allow extremely small tolerances. Thus, to inspect these structures, extremely high measuring accuracies (currently in the order of nanometers) are required. A method and a measuring device for determining the position of such structures is known from German Patent Application Publication DE 100 47 211 A1 and related U.S. Pat. No. 6,920,249, which is hereby incorporated by reference herein. For details of the above position determination explicit reference is made to these documents.

In the example of a measuring device 1 illustrated in FIG. 1, measuring stage 26 is formed as a frame so that sample 30 can also be illuminated with transmitted light from below. Above sample 30 is the incident-light, illumination and imaging device 2, which is arranged about an optical axis 20. (Auto)focusing is possible along optical axis 20 in the Z coordinate direction. Illumination and imaging means 2 comprises a beam splitting module 32, the above detector 34, an alignment means 33, and a plurality of illumination devices 35 (such as for the autofocus, an overview illumination, and the actual sample illumination). The objective displaceable in the Z coordinate direction is indicated at 21.

A transmitted-light illumination means with a height adjustable condenser 17 and a light source 7 is also inserted in granite block 23, having its light received via an enlarged coupling-in optics 3 with a numerical intake aperture which is as large as possible. In this way as much light as possible is received from light source 7. The light thus received is coupled-in in the coupling-in optics 3 into a light guide 4 such as a fiber-optic bundle. A coupling-out optics 5 which is preferably formed as an achromatic objective couples the light into condenser 17. The illumination light can also be coupled-in from light source 7 via a mirror assembly.

In order to achieve the required nanometer accuracy of the structural measurement it is essential to minimize as far as possible interfering influences from the environment, such as changes in the ambient air or vibrations. For this purpose the measuring device can be accommodated in a climate chamber which controls the temperature and humidity in the chamber with great accuracy (<0.01° C. or <1% relative humidity). To eliminate vibrations, as mentioned above, measuring device 1 is supported on a granite block with vibration dampers 24, 25.

The accuracy of determining the position of the structures is highly dependent on the stability and accuracy of the laser interferometer systems used for determining the stage position in X and Y coordinate directions. Since the laser beams of the interferometer propagate in the ambient air of the measuring device, the wavelength depends on the refractive index of this ambient air. This refractive index changes with changes in the temperature, humidity and air pressure. Despite the control of temperature and humidity in the climate chamber, the remaining variations of the wavelength are too strong for the required measuring accuracy. A so-called etalon is therefore used to compensate for measuring value changes due to changes in the refractive index of the ambient air. In such an etalon a measuring beam covers a fixed metric distance so that changes in the corresponding measured optical length can only be caused by changes in the measuring index of the ambient air. This is how the influence of a change in the refractive index can be largely compensated with the etalon measurement by continuously determining the current value of the wavelength and taking it into account for the interferometric measurement.

To achieve the highest accuracy, the laser distance measuring system is usually operated according to the heterodyne principle, which uses the possibility of splitting the laser beam into the two linearly polarized components (herein, the small frequency difference of the two Zeemann lines is used). The two components are split up in the interferometer, are used as measuring and reference beams, and again superimposed in the interferometer and made to interfere with each other. The laser distance measuring system used has a resolution of 0.309 nm per integer value (laser click) of the laser distance measuring system, at a wavelength $\lambda_{Laser}$ of the Laser of 632.8 nm.

To describe the accuracy of the measuring device described, usually the threefold standard deviation ($3\sigma$) of the measured average value of a coordinate is used. In a normal distribution of measuring values, statistically 99% of the measuring values are within a $3\sigma$ range about the average value. Indications as to repeatability are made by measuring a grid of points in the X and Y coordinate directions, wherein for each direction, after repeated measuring of all points, an average and a maximum $3\sigma$ value can be indicated. As a typical example, crossed chromium structures having a width of 1 μm of a 15×15 grid (pitch of the grid points: 10 mm) are measured on a quartz substrate. The measurement 2× (X and Y) 225points is repeated 20 times (20 passes). After a so-called multipoint correction, which allows all points of a pass to be commonly rotated and shifted, a repeatability (maximum value $3\sigma$ of the deviation of all $3\sigma$ values of the 450 points) of 1.5 to 2 nm is achieved. Without the multipoint correction, the values are between 2 and 6 nm.

A further improvement of the repeatability and therefore of the measuring accuracy of the measuring device described is desirable. Special attention has been paid in the present invention to the laser interferometer used for coordinate measurement of the measuring stage or for determining changes in the coordinates of this measuring stage. It is noted that the present invention is not limited to interferometers in the context of the measuring device described but can generally be used in laser-interferometric measurements.

From U.S. Pat. No. 5,469,260 an apparatus is known for measuring the position of a one or two dimensionally traversable stage by means of laser interferometry. For this purpose a stationary mirror is attached, for example, on the stationary optical system while the moveable stage carries a mirror along with it. In the well-known manner a laser beam is split in such a way that one part is incident on the stationary mirror while the other part is incident on the mirror which is carried along, and reflected on it. The reflected partial beams are made to interfere with each other wherein, by displacing the interference rings, a relative displacement of the mirror carried along with respect to the stationary mirror can be derived and the amount of this displacement can be determined.

As an example of the above measuring system, the position measurement of a wafer support stage during exposure of a wafer through a mask and an optical projection system (stepper) are discussed in the present document. Herein the position of the support stage relative to the stationary optical projection system is measured by means of interferometry. To measure the X and Y coordinates of the stage in a plane two interferometer systems are therefore necessary.

SUMMARY OF THE INVENTION

There are strong indications that a significant error component of the LMS IPRO, manufactured by Vistec Semiconductor System GmbH of Wetzlar, Germany, is caused by the interferometer error. This error is caused by the Agilent interferometer system. It has a sinusoidal form and can be observed to change with the stage position at a period length of $\lambda_{Laser}/4(=632.8$ nm$/4=158.2$ nm$)$ and $\lambda_{Laser}/2$, depending on the passage through the interferometer during which the error is produced. Since the reflection angle can vary slightly due to the mirrors on the stage body and the moveability of the stage body itself, and therefore the places of incidence of the laser beams in the interferometer as well as the superposition of measuring and reference beam are changed, so the amplitude and phase of the interferometer error also changes. While the change in the refractive index measured by the etalon correctly takes the associated position change into account, also over longer distances, it cannot compensate the interferometer error itself.

The correction of this error is therefore not precisely possible since it changes not only as a function of the measuring place on the mask but also over time. This is why the usual method of interferometer correction has reached its limits. The optimum consideration of this error should take the place and time of the measurement into account. This is ideally realized if a measuring logarithm is implemented, which simultaneously determines and calculates out the interferometer correction during each position measurement. I would like to present such an algorithm here. It is integrated in the existing method so that the measuring time should only be minimally affected.

An object of the present invention is to increase the measuring accuracy of a measuring system for the determination of positions of structures on a substrate and, at the same time, to eliminate the influence of the laser interferometer error on the measuring accuracy.

According to the present invention this object is solved by a method, in which first the stage moveable in the X/Y coordinate direction is traversed in such a way that a structure on a substrate is positioned in at least one predefined measuring window of the detector. Then a relative movement in the Z coordinate direction is carried out at least once, during which a plurality of images of the structure are taken by the detector in synchronism to the relative movement in the Z coordinate direction, and the position of the stage in the X and Y coordinate directions is determined also in synchronism to the imaging. Then the stage is traversed at least once by a distance in the plane defined by the X and Y coordinates, wherein the measuring window is also displaced by this distance. A relative movement in the opposite Z coordinated direction is produced at least once, wherein a plurality of images of the structure are taken by the detector in synchronism to the relative movement in the Z coordinate direction, wherein the position of the stage is determined in the X and Y coordinate directions also in synchronism to the imaging. Finally at least one actual position of the structure is determined from the Z position recorded in synchronism to the recorded images of the structure during the relative movement in the Z coordinate direction and opposite direction, and from the position of the stage determined in association to each image.

The position of the stage during imaging is determined by means of at least one laser interferometer, wherein the light of the laser interferometer has a wavelength of $\lambda_{Laser}$.

Prior to the measuring operation, a suitable value is determined for the distance by which the stage is traversed in the plane defined by the X and Y coordinate directions.

The distance by which the stage is traversed in a plane defined by the X and Y coordinate directions corresponds to an integer multiple of a ¼ of the wavelength $\lambda_{Laser}$ of the laser interferometer.

The distance by which the stage is traversed in the plane defined by the X and Y coordinate directions is composed by a component in the X coordinate direction and a component in the Y coordinate direction, wherein the two components can differ in magnitude.

The relative movement in the Z coordinate direction and in the opposite direction and the associated synchronous recording of a plurality of images of the structure is carried out in such a way that the stage is traversed in the plane defined by the X and Y coordinate directions immediately prior to the reversal of the Z direction.

At least one first predefined measuring window for measuring a coordinate is associated with the detector. A plurality of windows may be associated with it, wherein a further measuring window can be rotated, for example, by 90° with respect to the first measuring window. The measuring windows are quadrangles. The quadrangles can differ in size.

The traversing distance for the relative movement of the measuring objective is in the range of the depth of focus of each measuring objective to be used in the Z direction. The relative movement of the measuring objective in the Z direction comprises several tenths of nm up to a few micrometers.

According to a preferred embodiment, the relative movement in the Z coordinate direction is carried out once. Also, the stage is traversed by a distance in the plane defined by the X and Y coordinate directions once. Subsequently, the relative movement in the opposite Z coordinate direction is carried out once.

According to the method for high-precision measuring of coordinates on a substrate, it is particularly advantageous for the positioning of a structure to be carried out in at least one measuring window prior to the actual measuring process. Typically, the relative movement is carried out in the Z coordinate direction, wherein a plurality of images of the structure on the substrate are recorded by means of a CCD camera during the relative movement in the Z coordinate direction. The movement in the Z direction is primarily to determine the focus position with high-precision and in synchronism (coincidentally) with the other measuring values. It is also possible to carry out measurement without a relative Z movement. This does not, however, limit the claim with respect to the interferometer error. In parallel to the imaging (and the Z position measurement), the position of the stage during imaging is recorded with at least one laser interferometer. Subsequently the stage is traversed by a distance if possible displaced by half of the interferometer error period. To avoid another location of the structure being positioned in the measuring window, the measuring window is displaced accordingly. In the concrete case, at $\lambda_{Laser}/4$ (a period of 158 nm), there is a displacement of 80 nm, at $\lambda_{Laser}/2$, a displacement of 160 nm. Depending on each error situation, other values are also conceivable. This value can have been dynamically determined beforehand. This is, again, followed by the creation of a relative movement in the opposite Z coordinate direction, wherein a plurality of images of the structure on the substrate are again recorded by means of a CCD camera during the relative movement in the opposite Z coordinate direction. In effect, the interferometrically determined stage position, the recorded images of the two positions of the measuring windows and each synchronously recorded Z position during traversal in the Z direction and in the opposite direction are used for determining the position of the edges of the structure and the structure width.

According to a further embodiment, the stage is not only traversed by a single distance, but successively by two or more distances, each time accompanied by the recording of data.

According to a further embodiment, the traversal in the Z coordinate direction is only carried out until the focusing point is reached. At this Z position, the image measuring device is fixed. The recording of a sufficient amount of measuring data at this location if followed by a displacement in the coordinate measuring direction, and the measurement of further measuring data sets is carried out at this Z position. The structures can be elements, such as lines, spaces, dots, holes, hammerheads etc.

The structure on the substrate is for example formed as a cross. A plurality of crosses are applied on a testing mask as the substrate, wherein the crosses have a physical size of 4μm. The above-mentioned climate chamber is a chamber sealed as far as possible with respect to external atmospheric influences, such as temperature and moisture, with a regulating apparatus for maintaining constant the above mentioned parameters. Further parameters which change the refractive index are the composition of the atmosphere in the climate chamber and the pressure of this atmosphere. Usually, air is chosen as the atmosphere to have its temperature and moisture regulated. Without limiting the general applicability, an air flow will be referred to in the following.

BRIEF DESCRIPTION OF THE DRAWINGS

Exemplary embodiments of the invention and their advantages will be described in more detail in the following with respect to the accompanying drawings, in which.

DETAILED DESCRIPTION

Figure 1:
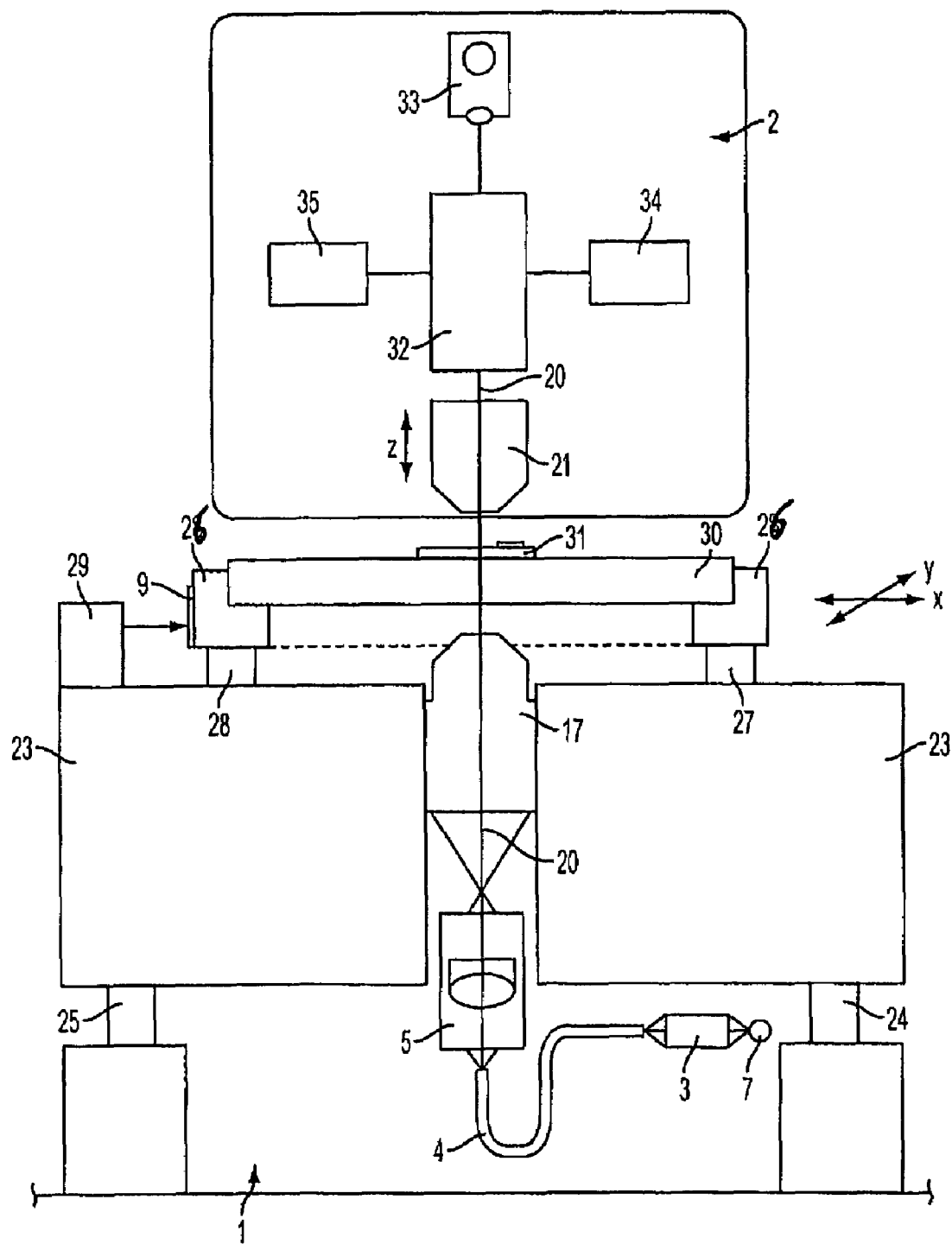
FIG. 1 schematically shows a coordinate measuring device, in which the position measuring method according to the present invention can be advantageously used.

A coordinate measuring device of the type shown in FIG. 1 has already been explained in detail in the introductory portion of the description.

The repeatability or reproducibility of such a coordinate measuring device is usually determined in the factory by measuring a measurement grid of 15 by 15 points (measuring area 6 inches, 152×152 mm). The value of the threefold standard deviation (3σ) is typically determined after 20 measurements for the coordinates obtained in the X and Y coordinate directions. The maximum value of this threefold standard deviation represents the repeatability and therefore the machine performance.

If the measurements are made locally on a defined mask position, i.e. in this case the X/Y measuring stage is not traversed, this is an indication for short-term reproducibility (here 20*100 measurements*4 sec=2.2 hours). This measurement gives an indication on the repeatability within a short period of time (so-called needle test).

Figure 2A:
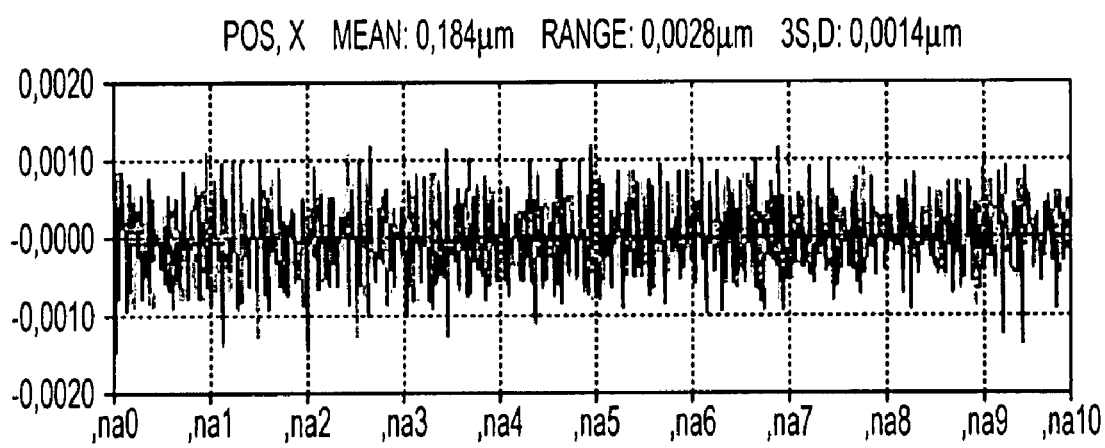
FIG. 2A shows the repeatability of the X coordinate direction in a measuring system according to FIG. 1, wherein the coordinate positions of a 15×15 grid are indicated for nine measuring passes, wherein for better detection of the repeatability, the average value of all nine measuring passes is subtracted from all positions at each grid position.
Figure 2B:
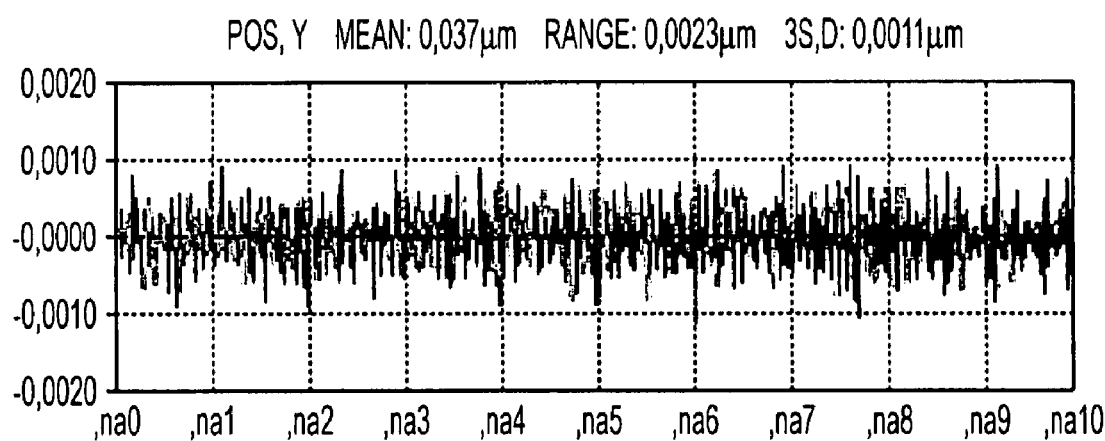
FIG. 2B shows the repeatability of the Y coordinate direction in a measuring system according to FIG. 1, wherein the coordinate positions of a 15×15 grid are indicated for nine measuring passes, wherein for better detection of the repeatability, the average value of all nine measuring passes is subtracted from all positions at each grid position.

The result of this measurement, more precisely of each value of the maximum threefold standard deviation (repeatability) are plotted in FIGS. 2A and 2B for the X or Y direction, respectively, against the measuring runs. The first measuring run is indicated as .NA0, the second as .NA1 etc. The position value is indicated in each graphical representation. 100 measuring values are taken per measuring run. The result is a repeatability of 1.4 nm in the X coordinate direction and 1.1 nm in the Y coordinate direction in a range of 2.8 nm in the X direction or 2.3 nm in the Y direction, respectively, wherein the range represents the difference between the maximum and minimum values and therefore a measure for the noise band.

When the short term reproducibility is determined (in the factory) of position X, Y (20fold measurement of a 15×15 dot grid at a grid pitch of 10 mm on a semiconductor mask), a clear dependence of the measured reproducibility can be observed (typical is 1.5 nm with a 3-fold standard deviation for the maximum value of all 450(15×15×2) individual points after correction of the drift) from the air pressure variation during the measuring time (typically 8hours)). A reason herefore can be seen in the interferometer error, which has a sinusoidal form (or an overlay of sinusoidal waves) and overlays with the stage position. The deviation varies primarily with the period length of $\lambda/4(=632.8$ nm$/4=158.2$ nm; $\lambda$=measuring wavelength of the interferometer system) and/or $\lambda/2$. As the air pressure changes, the density of the air also changes, and therefore the refractive index and, in turn, the measuring wavelength of the laser distance measuring system assumed to be constant, so that the short term reproducibility correlates with the variation of the air pressure. Test measurements show that the interferometer error is constant neither temporally in the long term nor spatially, and that therefore the measuring wavelength cannot be determined precisely enough and corrected by a single determination of the error proportion for the necessary measurement time (several hours) and the measuring places (140 mm×140 mm).

Figure 3:
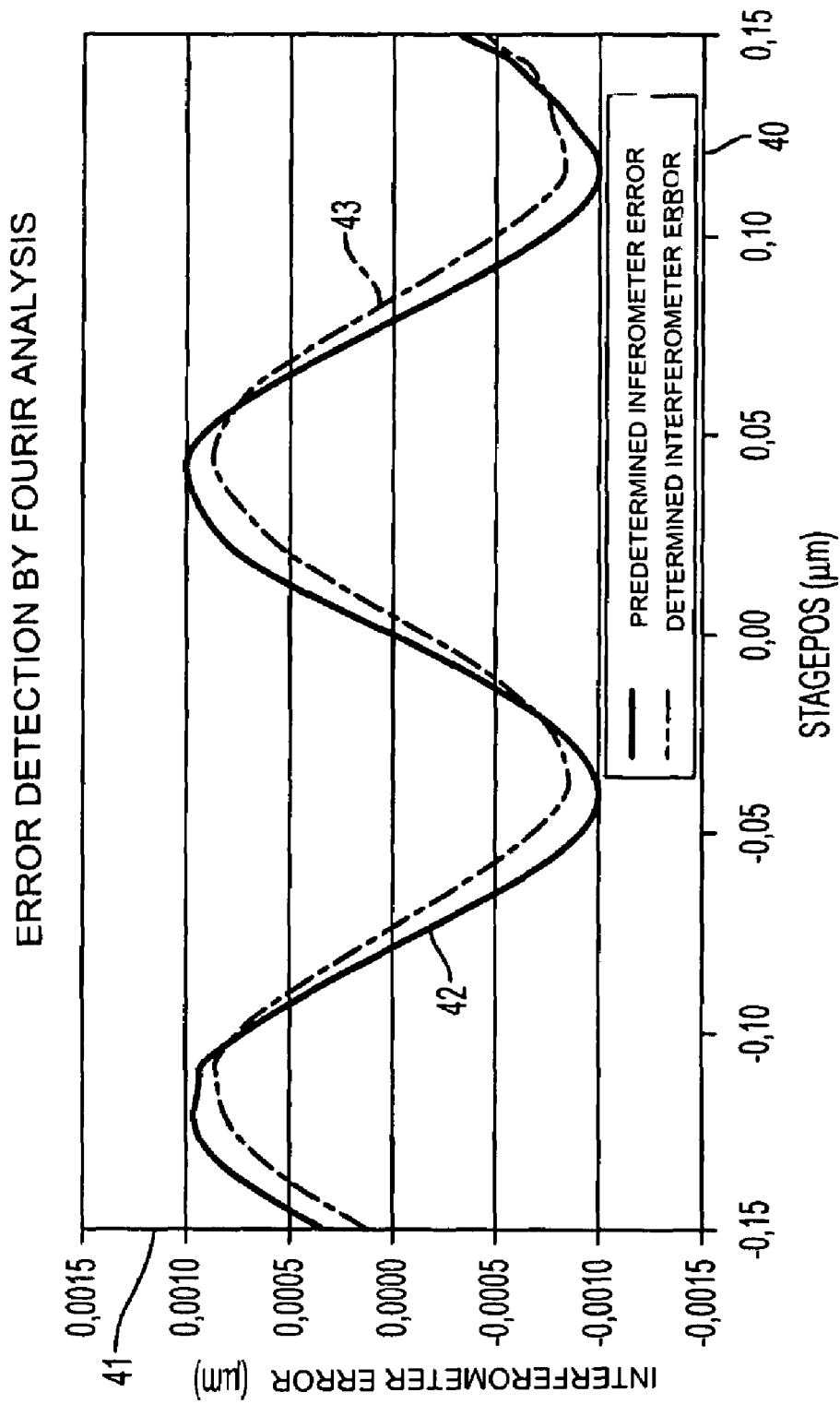
FIG. 3 shows the comparison of the interferometer error predetermined in the simulation with the error detected by means of the Fourier analysis of the measuring positions.

FIG. 3 shows the comparison of the interferometer error predetermined in the simulation with the error obtained by the Fourier analysis. The Fourier analysis (not FFT) currently appears to be the most precise mathematical method for determining the local 4/λ frequency. The abscissa 40 is the position of the measuring stage 26. The ordinate 41 is the interferometer error in μm. Herein, the interference is characterized by: The error is described by:

$$F(x) = a_s f_s(x) + a_c f_c(x)$$

$$\text{with } f_s(x) = \sin(kx) \ f_c(x) = \cos(kx) \ k = \frac{8\pi}{\lambda}$$

The amplitudes $a_s$ and $a_c$ for $f_s$ and $f_c$ are given by:

$$a_s = \frac{2}{x_{end} - x_{start}} \int_{x_{start}}^{x_{end}} p(x) f_s(x) dx \ a_c = \frac{2}{x_{end} - x_{start}} \int_{x_{start}}^{x_{end}} p(x) f_c(x) dx$$

Herein, p (x) is the function which results from the interpolation of the edge positions as a function of the stage position. Herein the predetermined interferometer error 42 and the interferometer error 43 determined by measurement are indicated.

The position of a structure is determined by measuring and averaging two different positions of the structure displaced with respect to each other by a portion of the period of the interferometer error or proportions thereof and by having the measurements succeed each other directly. Herein, the measuring window(s) of the measuring camera is/are also displaced in a corresponding manner with the position displacement by the X/Y stage 27 so that the two measuring results should theoretically provide the same position. The prior and well proven process of measuring the position by stopping the table 26 (via an electronic feedback stopping control in the X and Y positions) with position control and passing the focus position is maintained. After first passing the focus position (in the Z coordinate direction) the stage and the measuring window of the camera are displaced corresponding to the period of the interferometer error, and on the second or reverse pass of the focus position (in the opposite Z coordinate direction) the position is determined a second time. This also results in the measuring time being minimized.

Figure 4:
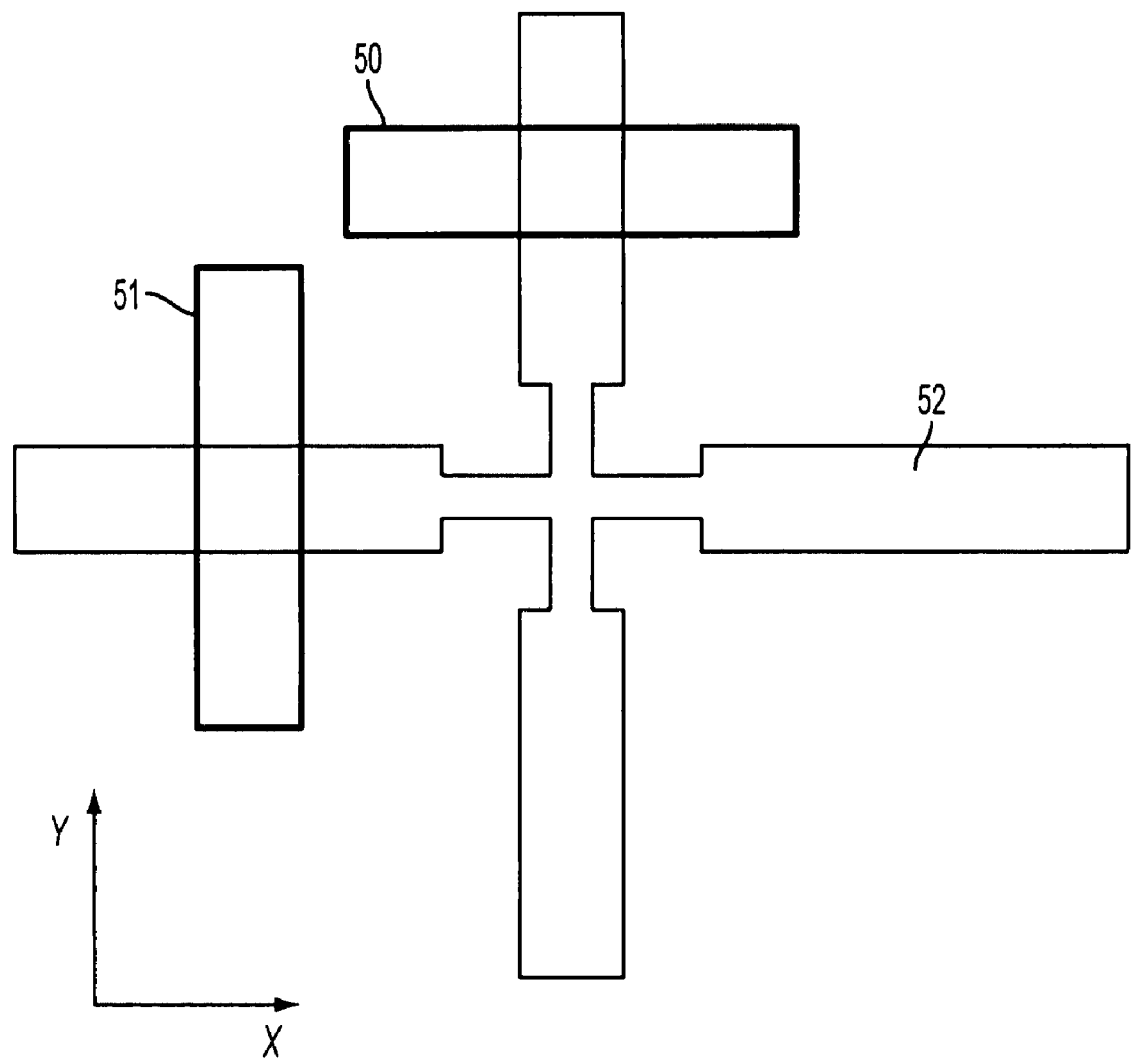
FIG. 4 shows a camera image of a cross structure, wherein two measuring windows are provided for determining the individual coordinates in the X coordinate direction and Y coordinate direction.

FIG. 4 shows the arrangement of a first measuring window 50 and a second measuring window 51 with respect to a cross structure 52 imaged by the camera frame. Each profile of the structure in measuring window 50, 51 is calculated from the pixels of each measuring window 50, 51. As already described above, the measuring window(s) 50, 51 is/are positioned on structure 52 to be measured, and subsequently the focus is changed by a relative movement in the Z direction (a relative movement of measuring objective 17 in the Z coordinate direction or in the direction of optical axis 20). The data from measuring window(s) 50, 51 are read out at different focus positions. From the read out data, that position in the Z coordinate direction is determined which provides optimum focus. While in FIG. 4 a cross structure is shown, this should not be construed as a limitation. A variety of structures can be measured with the method according to the present invention. Possible structures are lines, spaces, dots, holes, hammer-heads etc.

Figure 5:
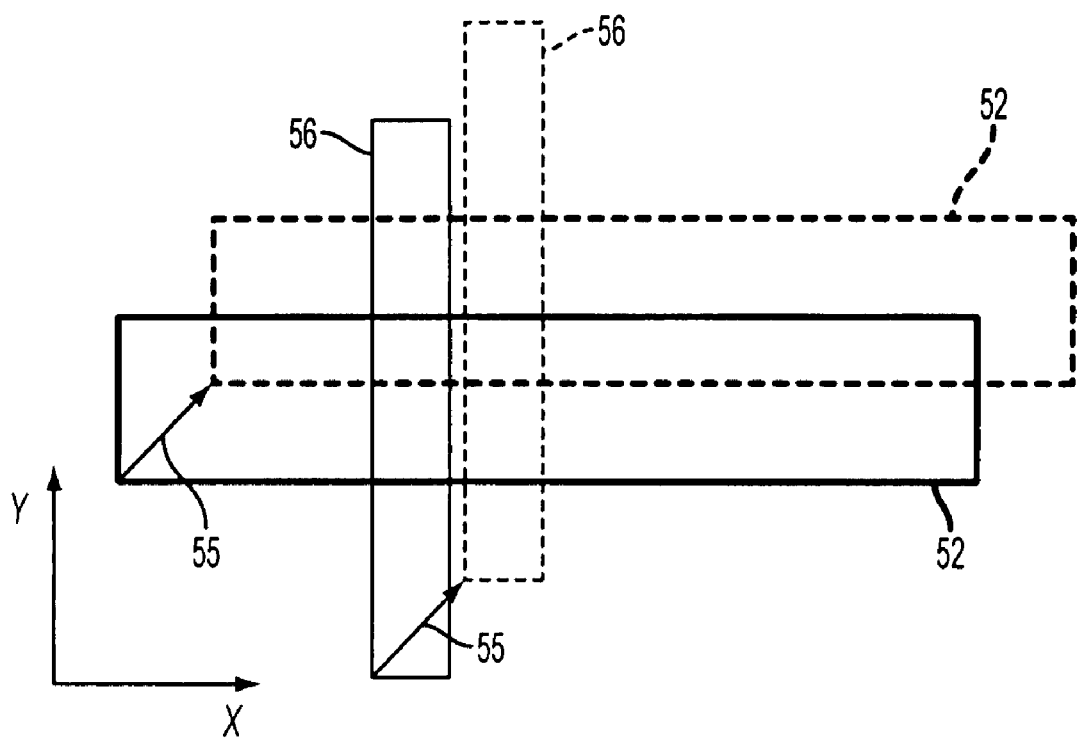
FIG. 5 shows the displacement of the structure by a predetermined distance and a corresponding displacement of the measuring window associated with the camera.

FIG. 5 shows shift 55 of structure 52 by a predetermined distance and a corresponding shift 57 of measuring window 56 associated with the camera. First structure 52 is measured with measuring window 56 of the camera or detector. To do this, a plurality of images of structure 52 on the substrate are taken during the relative movement in the Z coordinate direction by means of the CCD camera. In parallel, the position of the stage is also determined, which is carried out by a laser interferometer using light at a particular wavelength o. Once the plurality of images are recorded, the stage is traversed by a distance corresponding to wavelength $\lambda$ of the light used in the laser interferometer. The measuring window is shifted in a corresponding manner so that the same place on a structure is again positioned in each measuring window 56. Subsequently, a relative movement in the opposite Z coordinate direction is carried out wherein, again, a plurality of images of the structure on the substrate are taken by means of the CCD camera. Shift 55 is composed of a component in the X coordinate direction and a component in the Y coordinate direction. It is conceivable that the shift is first carried out in the X coordinate direction and subsequently in the Y coordinate direction.

Figure 6A:
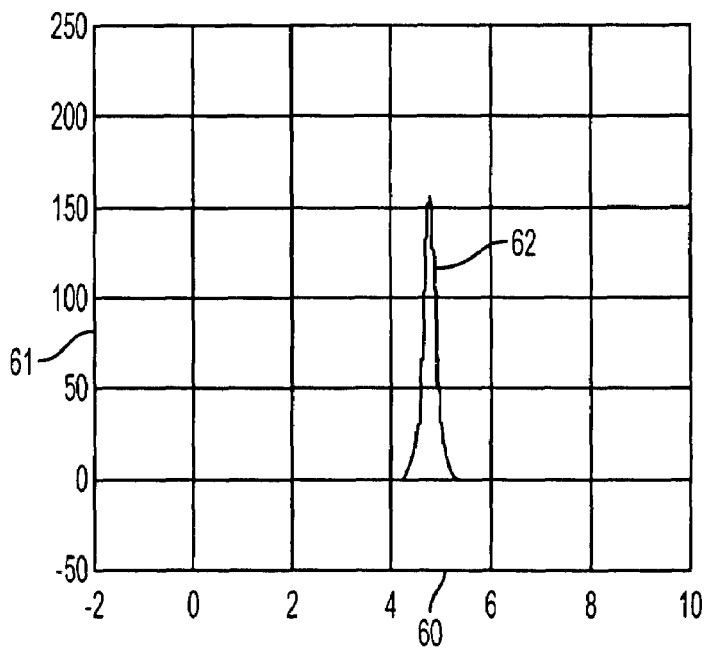
FIG. 6A shows an intensity profile of the structure recorded with the measuring window of the camera; the abscissa is the position in the camera image, the ordinate is the intensity.
Figure 6B:
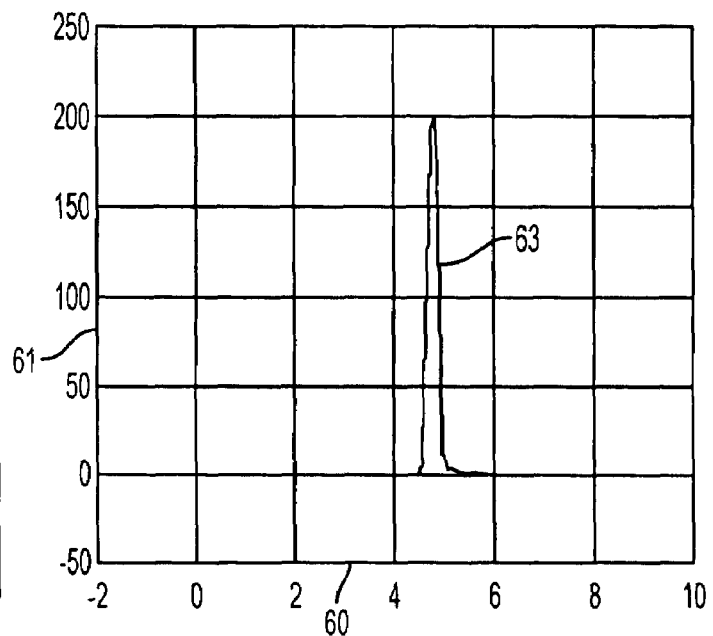
FIG. 6B shows an intensity profile of a different image during the scan in the Z coordinate direction of a structure, which was imaged with a measuring window of the camera; the abscissa is the position in the camera image, the ordinate is the intensity.
Figure 6C:
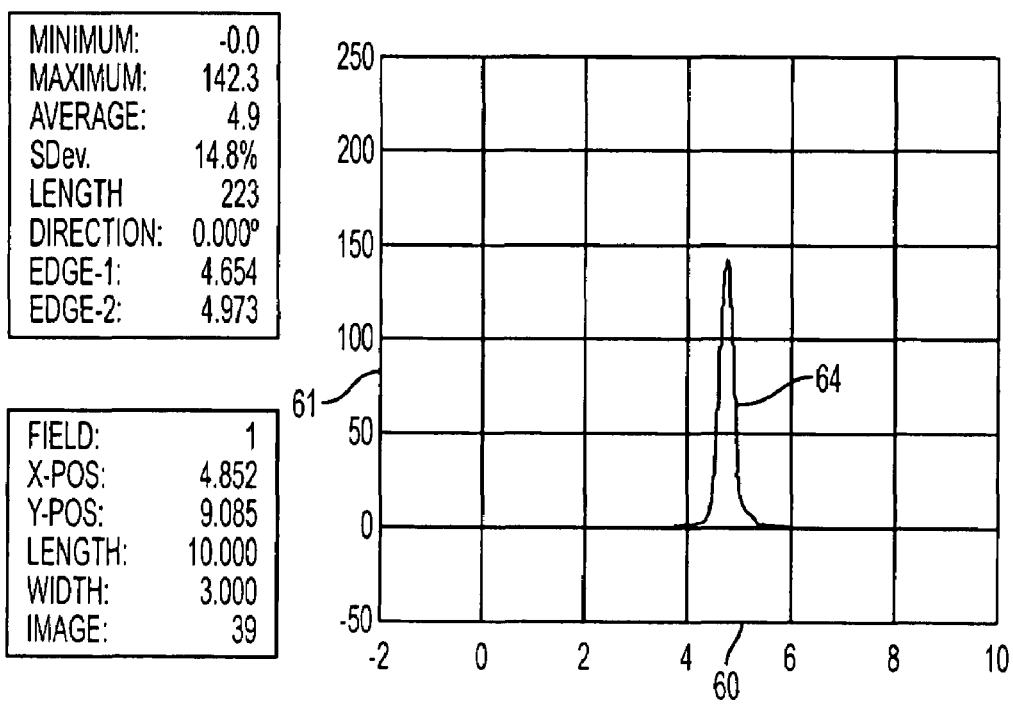
FIG. 6C shows another intensity profile of the structure, which was imaged with a measuring window; the abscissa is the position in the camera image, the ordinate is the intensity.

The different intensity profiles of a structure are shown in FIGS. 6A, 6B and 6C. The individual images from which the intensity profiles are obtained have been imaged at different Z positions of the measuring objective. Herein, abscissa 60 is the image position and ordinate 61 is the measured intensity in any suitable units. As repeatedly mentioned, several camera images are taken concurrently with the determination of the associated stage positions in the X coordinate direction and Y coordinate direction from the laser interferometer data and the focus values, or the values in the Z coordinate direction. As shown in FIG. 4, at least one measuring window is positioned above the structure to be measured. During the relative movement in the Z coordinate direction, 50 images are taken during the relative movement. The number of profiles results from the product of the number of images and the number of measuring windows. If a relative movement is carried out in the opposite Z coordinate direction, the number of the recorded images is doubled. FIG. 6A shows for example an intensity profile 62 of the $19^{th}$ recorded image. FIG. 6B shows intensity profile 63 of the $29^{th}$ recorded image during the movement in the Z coordinate direction. FIG. 6C shows intensity profile 64 of the structure of the $39^{th}$ recorded image during the relative movement in the Z coordinate direction. A difference in the signal magnitude and the signal form as a function of the position of the image just recorded during the movement in the Z coordinate direction can be clearly seen from a comparison of the individual images of FIGS. 6A, 6B and 6C. The signal magnitude or the slope of the profile edge is a measure for the contrast and therefore the focus or the focus position.

Figure 7:
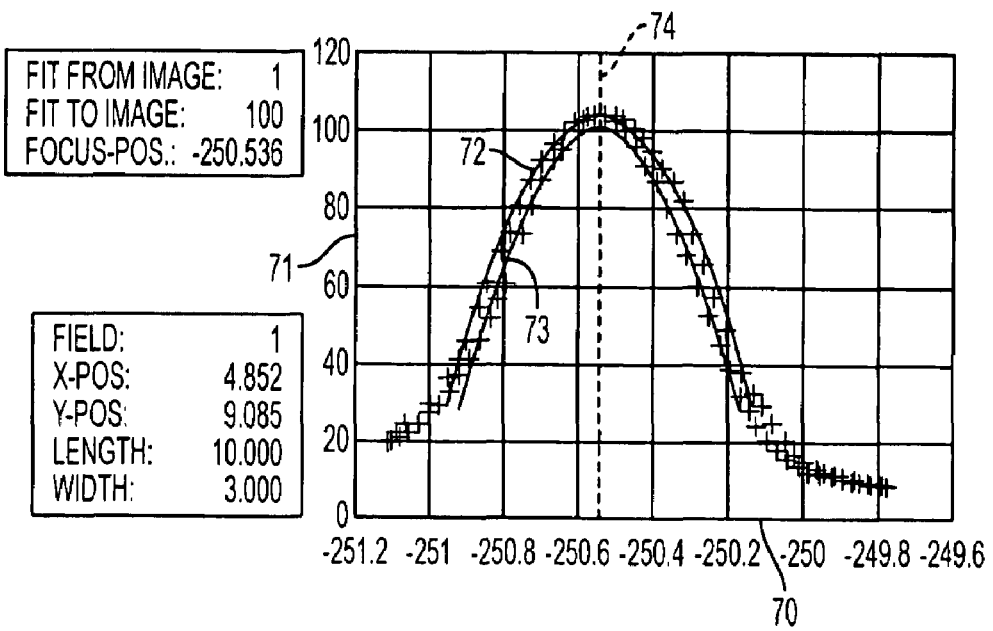
FIG. 7 shows the contrast value of the different images of the profiles as a function of the Z value, wherein the plurality of the profiles have been recorded during the scan in the Z coordinate direction and the opposite direction.

FIG. 7 shows the contrast values of 100 profiles resulting from passing the "true" focus point twice. This is why abscissa 70 is the position of the focus or the position of the measuring objective in the Z coordinate direction. Ordinate 71 is the contrast value of the measured intensity profiles of the structure. The contrast of the individual profiles is shown as a function of the value in the Z coordinate direction. The individual measuring points are fitted to a curve, so that maxima result for each of the curves. The first curve 72 is fitted to those intensity profiles which result from the measured intensity profiles resulting from the movement of the measuring objective in the Z coordinate direction. The second curve 73 is fitted to those intensity profiles which result from the measured intensity profiles resulting from the movement of the measuring objective in the opposite Z coordinate direction. One of the maxima is indicated by a broken line 74 and therefore represents the best focus.

Figure 8:
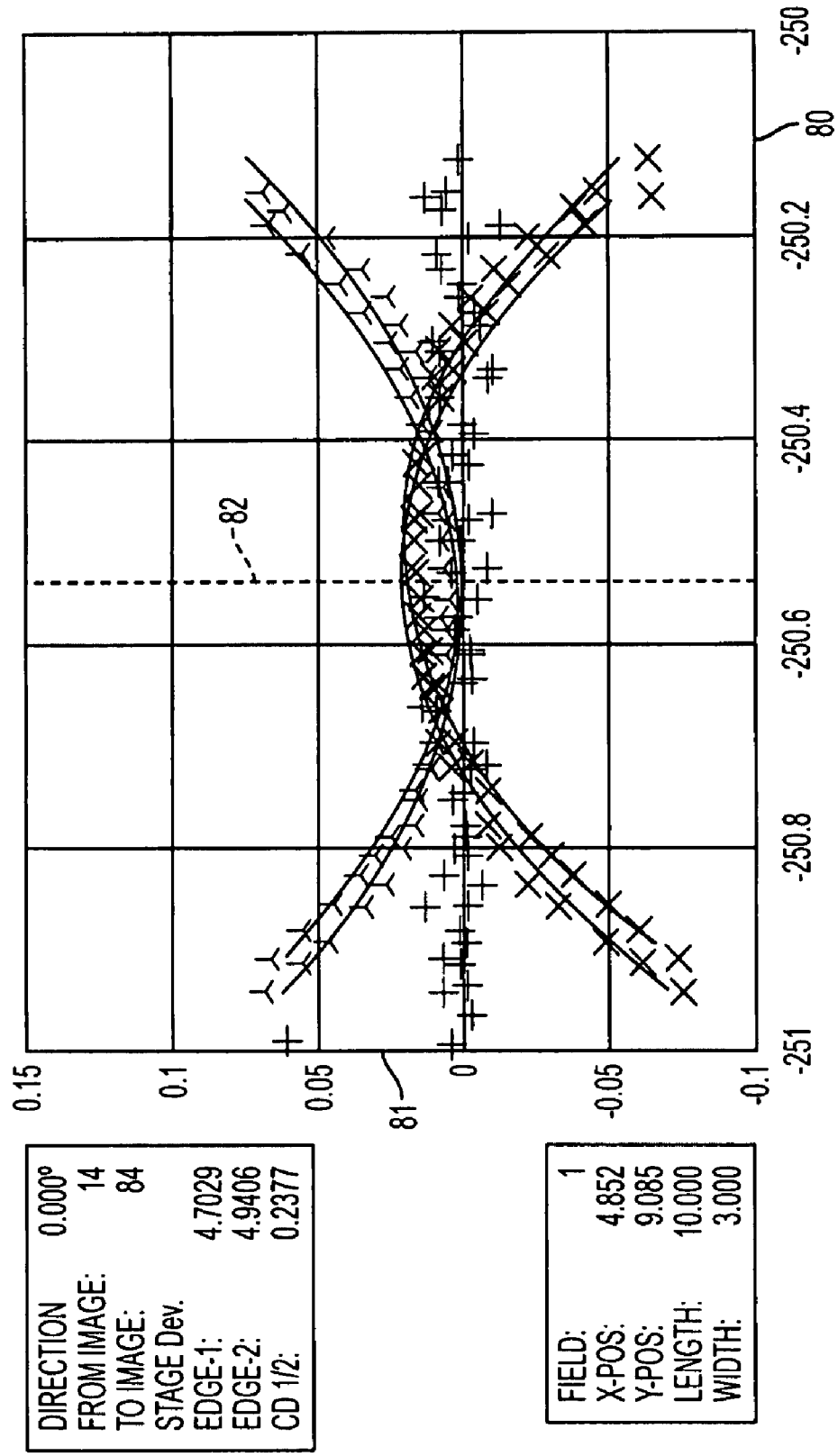
FIG. 8 shows the position of the left and right edges as a function of the position in the Z coordinate direction, wherein the ordinate is the deviation of the measured stage positions from the setpoint position.

In FIG. 8, each position of the left and right edges of a structure are indicated as a function of the position in the Z coordinate direction. Abscissa 80 is the focus position. Ordinate 81 is the deviation of the edge position from the setpoint value in $\mu m$. One measuring window 52 was used for each determination of the position of the left and right edges (see illustration in FIG. 4). Each position of the edge with respect to each position in the Z coordinate direction can be calculated from the individual profiles as shown, for example, in FIGS. 6A, 6B and 6C. The structure just measured in the image of the camera can thus be obtained from the average value of the two edges. This image position and the position data determined from the measurement with the laser interferometer are added. The graphic representation of this addition can be seen from FIG. 8. The position of the two edges of a structure, and consequently the position of the structure itself in a coordinate direction can be obtained from the intersection point with broken line 82 (representing the point of the optimum focus).

Figure 9A:
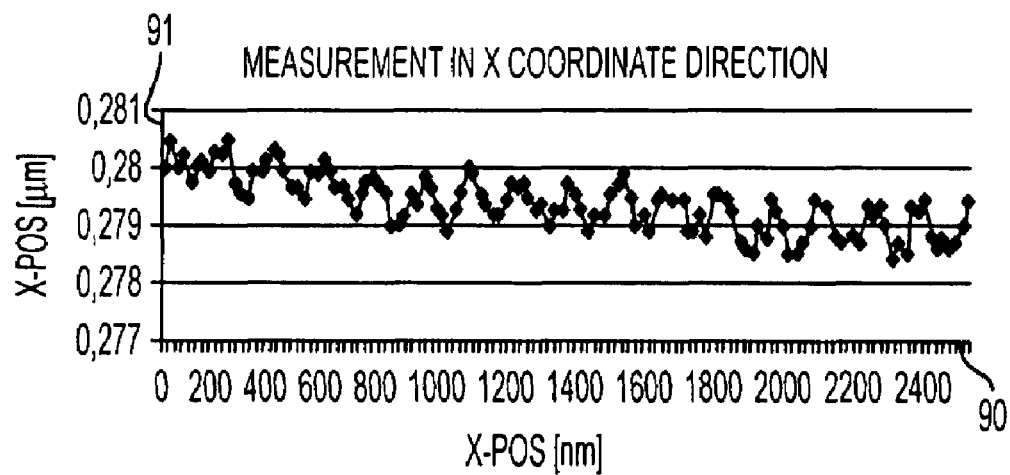
FIG. 9A shows the deviation of the measuring values of the position measurement from the setpoint value in the X coordinate direction, due to the interferometer error.
Figure 9B:
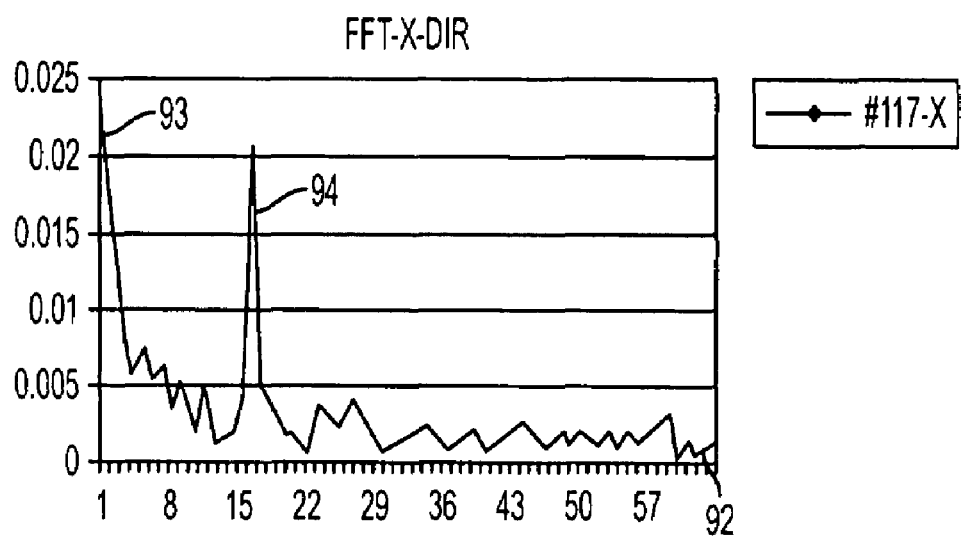
FIG. 9B shows the Fourier transform of the position spectrum shown in FIG. 9A, wherein the peak is caused by the interferometer error $\lambda_{Laser}/4$.

FIG. 9A shows the deviation from the setpoint value of the position measurement in the X coordinate direction which is due to the interferometer error. The abscissa 90 is the X position in nm. Ordinate 91 is the measured X position in $\mu m$. The data are recorded by equidistant position shifting with a concurrent shift of the measuring window for the X coordinate direction. In the measured position area of about 2.5 $\mu m$ the signals show a drift of about 1 nm. This is due to non-linearities of the measuring structure on the order of $\mu m$ (e.g. of the mirror body) and the general machine drift (on the order of nm, since the machine is never completely still). The signals shown in FIG. 9A also show a periodicity which can be associated with certain frequencies or wavelengths. FIG. 9B shows the Fourier transform of the measured position spectrum, which is shown in FIG. 9A. Abscissa 92 shows the wave numbers resulting from the Fourier transformation of 256 points, and ordinate 93 is subdivided in any suitable unit. A clear peak 94 can be seen in FIG. 9B, which corresponds to a wavelength of about 158 nm. This peak 94 corresponds to about a quarter of the measuring wavelength of the laser light used in the interferometer (in one embodiment the wavelength of the light is 633 nm). This behavior is also predicted by theory.

Figure 10A:
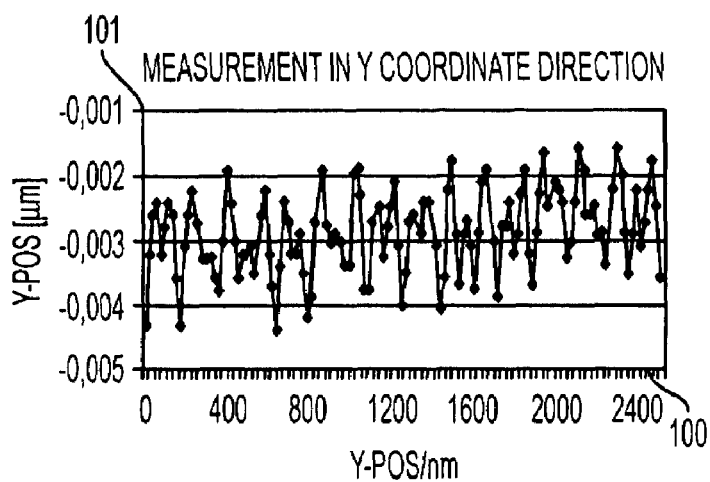
FIG. 10A shows the fluctuation of the measuring values of the position measurement in the Y direction from the setpoint value, due to the interferometer error and a camera characteristic.
Figure 10B:
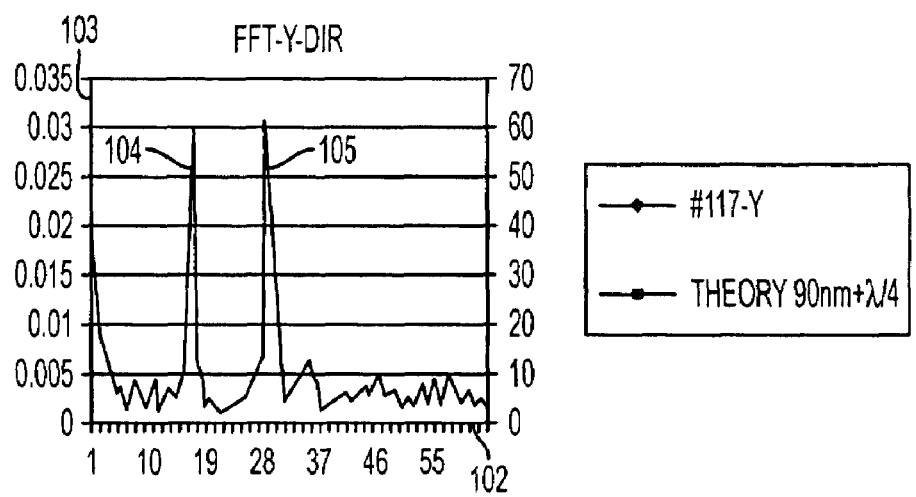
FIG. 10B shows the Fourier transform of the position spectrum shown in FIG. 10A, wherein the peak, again, corresponds to $\lambda_{Laser}/4$ and the peak is caused by the differing gain of even and odd camera lines.

FIG. 10A shows the position measurement of a structure on the substrate in the Y coordinate direction. Abscissa 100 is again the Y position on which the measurement is currently carried out with the measuring window. Ordinate 102 is the measured Y position of the structure in μm. The data are also recorded by equidistant position shifting with a concurrent shift of the measuring window in the Y coordinate direction. In the measured position area of about 2.5 μm, the signals, again, show a drift of about 1 nm. FIG. 10B shows the Fourier transform of the measured position data, which are shown in FIG. 10A. Abscissa 102 is in nm, and ordinate 103 is subdivided in any suitable units. The Fourier transform shown in FIG. 10B also shows a peak 104 corresponding to about a quarter of the measuring wavelength, and also a peak corresponding to the period of 90 nm. The 90 nm peak 105 arises due to non-linearities of the camera which operates with two analog amplifiers which cannot be trimmed over the whole of the amplification range. The lines of pixels are therefore alternately and differently read out with two amplifiers. The pixel width of the CCD sensor used here is 45 nm. This is averaged out in the X coordinate direction, while in the Y coordinate direction, this period cannot be averaged out. Errors with half of the measuring wavelength occur as well as errors at a quarter of the measuring wavelength as shown in FIGS. 9B and 10B. Since the occurring interferometer errors are constant neither temporally (in the period of hours) nor spatially (on the order of mm), they cannot be corrected just once. This means that they have to be determined or compensated for with the measuring method "in situ" in the position measurement.

The measuring method used must be explained for better understanding of the invention. The measuring value is obtained from a comparison of the actual measuring distance with a fixed reference distance. The measuring light is therefore split up into a measuring and a reference beam. It has to be considered that there is not only a change in the measuring distance, but that the laser wavelength itself is changed due to the dependence on pressure (temperature, air composition) of the refractive index. This variation is determined by a further interferometric measurement both prior to and during the actual position measurement. This etalon correction varies in the amount of several hundreds of nm and, due to the measuring structure, it depends primarily on air pressure fluctuations, since the temperature and humidity or the gas composition can be maintained almost constant by means of the climate chamber. The etalon correction affects both the correction of the measuring value and the determination of the position reached on the structure itself. The latter occurs because when the measuring position is reached by the stage, the etalon correction causes the structure to be measured to have the same position relative to the measurement camera up to a deviation of a few nm. As a result, the 90 nm error due to the CCD camera has a relatively small error proportion. The interferometer errors due to the laser, however, depending on the magnitude of the air pressure fluctuations and depending on each "position" on the approximately sinusoidal interferometer error curve, are introduced into the measuring result up to their full amplitude.

Figure 11:
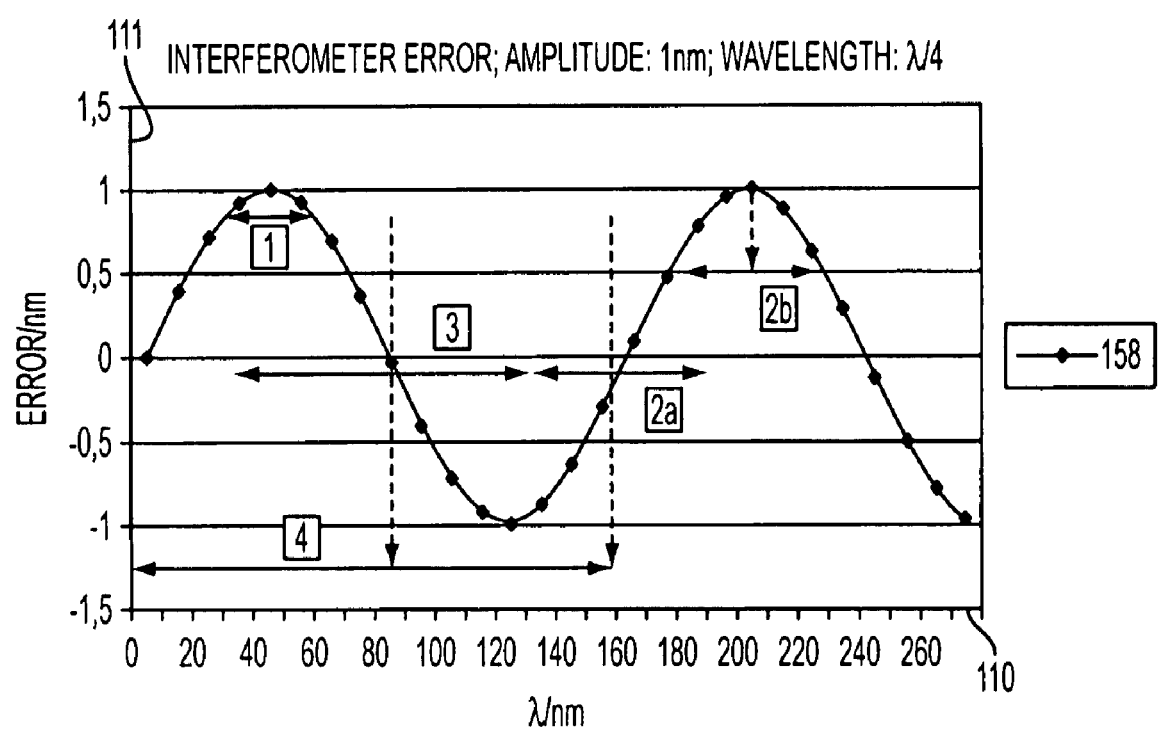
FIG. 11 shows the sinusoidal interferometer error curve, which is introduced into the measuring result up to the full amplitude of 1 nm.

FIG. 11 schematically shows the effects of air pressure fluctuations on the resulting interferometer error. Abscissa 110 is the position in nm. Ordinate 111 is the interferometer error in nm. The sinusoidal curve represents the error proportion of the interferometer measuring system in a small area (300 nm) of the substrate. The solid arrows mark different air pressure ranges, passed through during a reproducibility measurement (e.g. 20 measurements each in the "same" position); the longer the arrow the greater the pressure fluctuation. The vertical, broken-line arrows mark the magnitude of the associated error. FIG. 11 shows that the probability of measuring the whole of the error budget rises with the air pressure variation (see indications 1-4 in FIG. 11). When the sample is in an unfavorable position with respect to the distance measuring system, however, the entire error budget can be exhausted even with small pressure fluctuations (see indication 3). The error can also be of different magnitude, even with equal pressure fluctuations (see indications 2A or 2B), depending on the area of the sinusoidal curve in which the measuring values are located. From a certain magnitude (see indication 4) the error budget is exhausted, except if the error amplitude itself is position dependent. This is true to a small extent because of the different reflection and material properties of the optical components.

The determination of the position of a structure on the substrate is carried out in the method according to the present invention by measuring and averaging two positions shifted with respect to each other by a portion of the period of the interferometer error or interferometer error percentages and having the measurement in direct temporal sequence. Herein, the measuring window of the CCD camera is shifted together with the position shift, so that the two measuring results should theoretically provide the same position. The prior and well-proven measuring process of the position by stopping the X/Y stage via an electronic feedback stopping control in the X and Y directions, with position control of passing the focus position and synchronous imaging is maintained. Upon first passing the focus position, the X/Y stage and the measuring window of the CCD camera are shifted corresponding to the period of the interferometer error, and during the second, or reverse, pass of the focus position (traversal in the reverse Z coordinate direction) the position of the structure is determined a second time.

Figure 12:
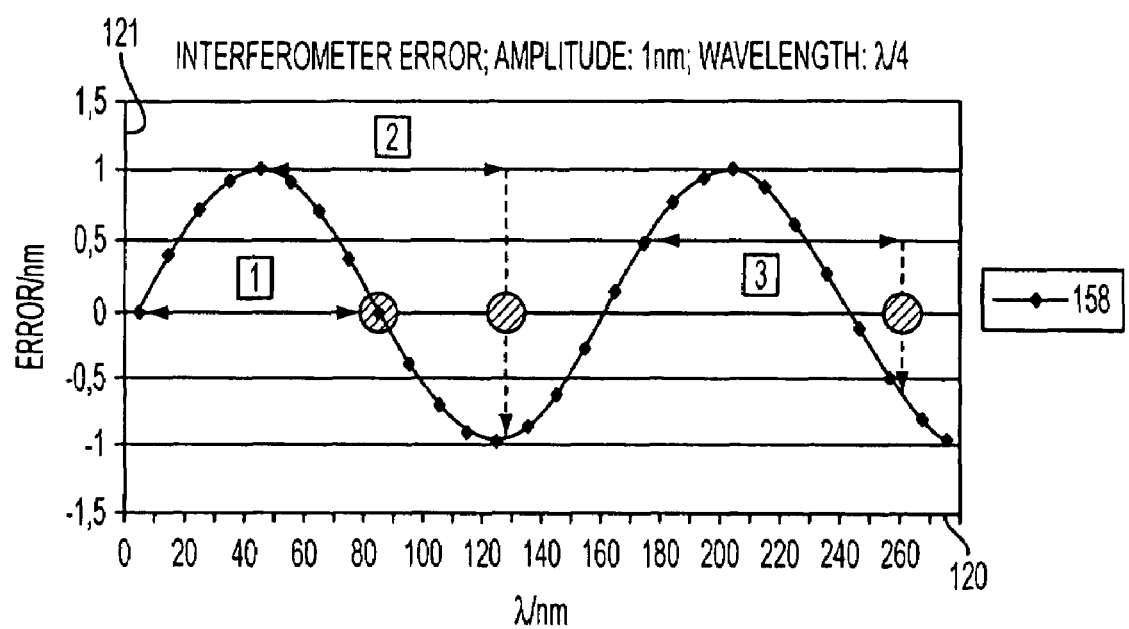
FIG. 12 shows a schematic view of the effect of the Dual Scan.

FIG. 12 shows a schematic representation of the operation of the so-called Dual Scan (traversing the measuring objective in the Z coordinate direction and subsequently in the opposite Z coordinate direction). Abscissa 120 is the position λ in nm. Ordinate 121 is the interferometer error in nm. Each position of a structure on the substrate is measured twice. The second measuring place is shifted by half of the period of the error curve (here 158/2 nm=79 nm). The two arrow points of each solid-line double arrow mark these two points. Averaging the two measurements compensates for the measuring error due to the interferometer. Herein, the point on the error curve on which the first measurement is carried out is immaterial. The second measurement is shifted in such a way that there is always a compensation. Another advantage is that two measurements are taken. The positional measuring accuracy is correspondingly increased, in particular also the accuracy of the CD measurement. If error portions with different wavelength are mixed (see FIG. 13) there is only a partial compensation.

Figure 13:
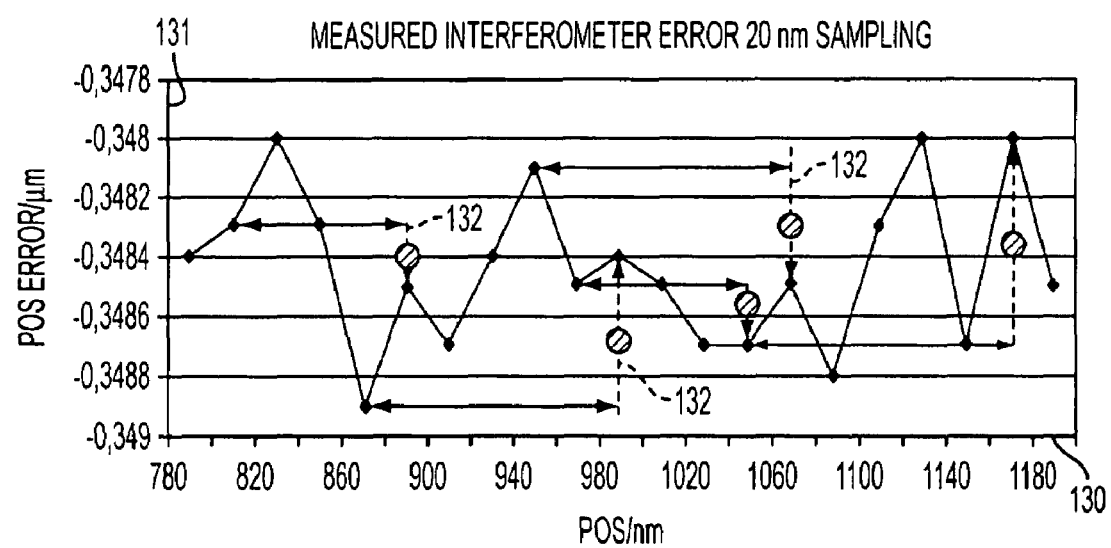
FIG. 13 shows the measured data without drift correction, wherein the data is recorded by displacement in steps of 20 nm.

FIG. 13 shows the measured data without drift correction, wherein the data are recorded by shifting the measuring structure in steps of 20 nm. Abscissa 130 is the position in nm. Ordinate 131 is the position error in μm. The double arrows mark two measurements with a shift of 80 and 120 nm. The broken-line, vertical arrows 132 mark the effect of the compensation.

Figure 14:
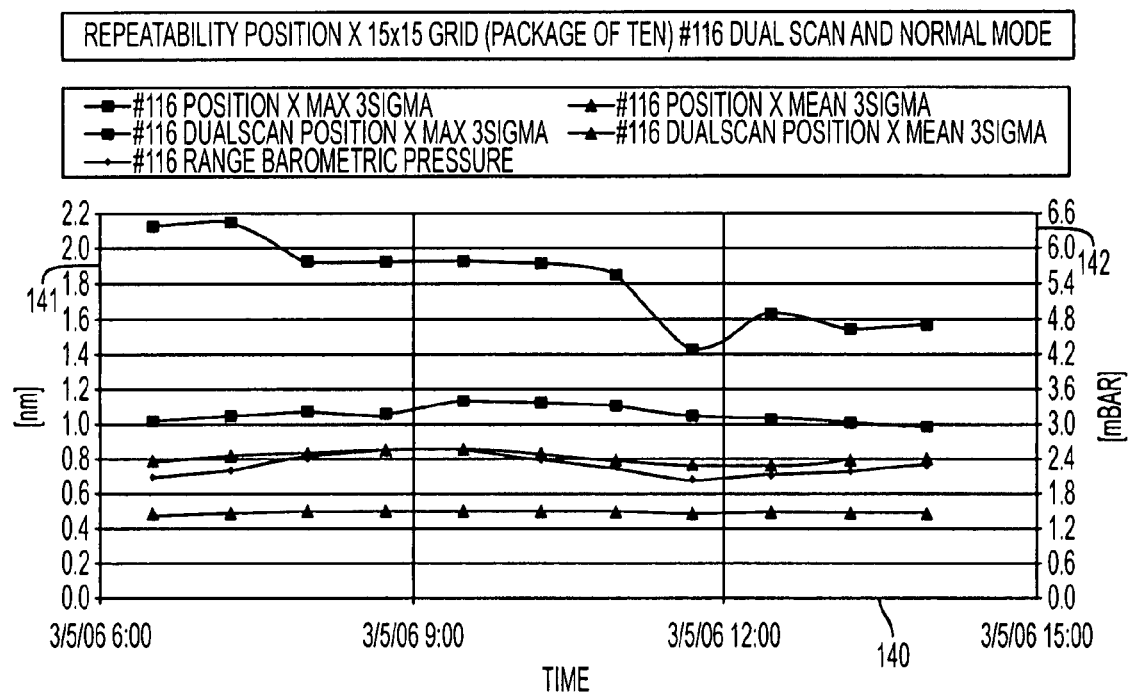
FIG. 14 shows the comparison of the measuring results obtained with the new "Dual Scan" method by an LMS IPRO3, with the measuring results obtained the previous method "Normal Mode".

Measuring results obtained by the method according to the present invention, the so-called Dual Scan, are presented on an LMS IPRO3. The results are compared with the measuring results of the prior method (Normal Mode) (see FIG. 14). Abscissa 140 is the time in hours. First ordinate 141 is the position deviation in nm. Second ordinate 142 is the change in air pressure in mbar. All data are evaluations of a 15×15 grid of crosses measuring 4 μm on testing masks. For each 10 subsequent measuring results, the maximum 3 sigma value for the positions in the 15×15 grid, the mean 3 sigma value for the positions in the 15×15 grid and the fluctuation range of the barometric pressure during the measurement of the 10 passes is indicated. The evaluation was done "on the fly", i.e. 10 subsequent loops were evaluated in one go. This means that first the first 10 loops, then loop 1 to 11, then loop 2 to 12, were evaluated etc. So 11 measuring values are obtained from 20 loops, for example, as shown in FIG. 14. The data were measured "concurrently" with Dual Scan and Normal Mode (two sites in one job, with site1=Dual Scan and site2=Normal Mode). There is therefore only one curve for the fluctuation range of the barometric pressure. The measurements with Dual Scan were carried out with 50 images for each scan and a shift of the X/Y stage of 80 nm between the two scans. The measurements in the Normal Mode were carried out with 50 images. The air pressure fluctuations were quite small at 1.6 mbar. At least in the Y direction a dependence on the air pressure could still be seen. The air pressure dependence was substantially smaller with Dual Scan.

What is claimed is:

1. A method for precision measurement of coordinates of at least one structure on a substrate placed on a stage moveable in X/Y coordinate directions in an interferometric-optical measuring system, the at least one structure on the substrate being imaged onto at least one detector via a measuring objective having an optical axis aligned in a Z coordinate direction, the method comprising the following steps:

traversing the stage moveable in the X/Y coordinate directions in such a way that the at least one structure on the substrate is positioned in at least one predefined measuring window of the at least one detector;

carrying out a relative movement in the Z coordinate direction at least once, wherein in synchronism to the relative movement in the Z coordinate direction, a plurality of images of the at least one structure are recorded by the at least one detector, and determining a position of the stage in the X and Y coordinate directions also in synchronism to the recording;

traversing the stage at least once by a distance in a plane defined by the X and Y coordinate directions, and shifting the at least one predefined measuring window also by the distance;

carrying out a further relative movement in a further direction opposite the Z coordinate direction at least once, wherein a further plurality of images of the at least one structure are further recorded by the at least one detector in synchronism to the further relative movement in the further direction, and determining a further position of the stage in the X and Y coordinate directions also in synchronism to the further recording; and determining at least one actual position of the at least one structure from a Z position recorded synchronously to the recorded images of the at least one structure during the relative movement and the further relative movement, and from the position of the stage and the further position of stage determined for each image.

2. The method according to claim 1, wherein the position of the stage during imaging is obtained by at least one laser interferometer, wherein a light of the laser interferometer has a wavelength of $\lambda_{Laser}$.

3. The method according to claim 1, wherein prior to the determining step a suitable value is obtained for the distance by which the stage is traversed in the plane defined by the X and Y coordinate directions.

4. The method according to claim 1, wherein the distance by which the stage is traversed in the plane defined by the X and Y coordinate directions corresponds to an integer multiple of a quarter of the wavelength $\lambda_{Laser}$ of the laser interferometer.

5. The method according to claim 4, wherein the distance by which the stage is traversed in the plane defined by the X and Y coordinate directions corresponds to a quarter of the wavelength $\lambda_{Laser}$ of the laser interferometer.

6. The method according to claim 5, wherein the distance by which the stage is traversed in the plane defined by the X and Y coordinate directions is composed by a component in the X coordinate direction and a component in the Y coordinate direction, wherein the two components are of different magnitudes.

7. The method according to claim 1, wherein the relative movement and further relative movement, as well as the corresponding synchronous imaging of a plurality of images of the at least one structure, is carried out at least twice, wherein the stage is traversed by different distances in the plane defined by the X and Y coordinate directions.

8. The method according to claim 1, wherein after a first pass of the relative movement in the Z coordinate direction, a range in the Z coordinate direction is dynamically adapted.

9. The method according to claim 1, wherein the at least one detector has first and second predefined measuring windows, wherein the second measuring window is rotated by 90° with respect to the first measuring window.

10. The method according to claim 1, wherein the at least one measuring window includes a plurality of measuring windows, the measuring windows being quadrangles.

11. The method according to claim 10, wherein the quadrangles are different in size.

12. The method according to claim 1, wherein the traversal distance for the relative movement of the measuring objective in the Z coordinate direction is in a depth of focus range of the measuring objective.

13. The method according to claim 12, wherein that the relative movement of the measuring objective in the Z coordinate direction comprises several tens of nm to several μm.

14. The method according to claim 1, wherein the relative movement in the Z coordinate direction is carried out once, the stage is traversed by a distance in the plane defined by the X and Y coordinate directions, and in that the relative movement in the opposite Z coordinate direction is carried out once.

15. A method for operating an apparatus for determining a position of a structure or a structural width of the structure or overlay data with substrates comprising:

precisely measuring coordinates of at least one structure on a substrate placed on a stage moveable in X/Y coordinate directions in an interferometric-optical measuring system including imaging the at least one structure on the substrate onto at least one detector via a measuring objetcive having an optical axis aligned in a Z coordinate direction; and wherein the precisely measuring coordinate step includes:

traversing the stage moveable in the X/Y coordinate directions in such a way that the at least one structure on the substrate is positioned in at least one predefined measuring window of the at least one detector;

carrying out a relative movement in the Z coordinate direction at least once, wherein in synchronism to the relative movement in the Z coordinate direction, a plurality of images of the at least one structure are recorded by the at least one detector, and determining a position of the stage in the X and Y coordinate directions also in synchronism to the recording;

traversing the stage at least once by a distance in the plane defined by the X and Y coordinate directions, and shifting the at least one measuring window also by this distance;

carrying out a further relative movement in an opposite Z coordinate direction at least once, wherein a further plurality of images of the at least one structure are further recorded by the at least one detector in synchronism to the further relative movement in the Z coordinate direction, and determining a further position of the stage in the X and Y coordinate directions also in synchronism to the further recording; and determining at least one actual position of the at least one structure from a Z position recorded synchronously to the recorded images of the at least one structure during the relative movement and the further relative movement, and from the position and the further position of the stage determined for each image.

* * * * *